United States Patent [19]

Pendse

[11] Patent Number: 5,448,020
[45] Date of Patent: Sep. 5, 1995

[54] SYSTEM AND METHOD FOR FORMING A CONTROLLED IMPEDANCE FLEX CIRCUIT

[76] Inventor: Rajendra D. Pendse, 5245 Diamond Common, Fremont, Calif. 94555

[21] Appl. No.: 169,823

[22] Filed: Dec. 17, 1993

[51] Int. Cl.6 ............................................. H05K 1/00
[52] U.S. Cl. .................. 174/250; 174/254; 174/256; 174/258; 174/259; 361/749; 361/750; 361/794
[58] Field of Search ............... 174/250, 254, 256, 257, 174/258, 259; 361/748, 749, 750, 751, 794

[56] References Cited

U.S. PATENT DOCUMENTS

| | | | |
|---|---|---|---|
| 4,912,547 | 3/1990 | Bilowith et al. | |
| 4,912,547 | 3/1990 | Bilowith et al. | 357/80 |
| 5,025,114 | 6/1991 | Braden . | |
| 5,068,708 | 11/1991 | Newman . | |
| 5,068,708 | 11/1991 | Newman | 357/68 |
| 5,142,351 | 8/1992 | Matta | 357/70 |
| 5,208,188 | 5/1993 | Newman | 437/220 |
| 5,367,196 | 11/1994 | Mahulikar et al. . | |

*Primary Examiner*—Leo P. Picard
*Assistant Examiner*—Cheryl R. Figlin

[57] ABSTRACT

A system and method for providing a controlled impedance flex circuit includes providing an insulative flexible substrate having opposed first and second surfaces and having through holes extending from the first surface to the second surface. A pattern of conductive traces is formed on the first surface of the flexible substrate. A film of conductive adhesive is applied to the second surface and to the through holes. The through holes are aligned to contact ground traces in the pattern of conductive traces on the first surface. Thus, a ground plane is established for creating an environment for high frequency signal propagation. The conductive adhesive may be a b-stage epoxy or a thermoplastic material. In the preferred embodiment, a tape automated bonding frame is fabricated.

8 Claims, 2 Drawing Sheets

SYSTEM AND METHOD FOR FORMING A CONTROLLED IMPEDANCE FLEX CIRCUIT

TECHNICAL FIELD

The present invention relates generally to flexible circuits such as tape automated bonding frames and more particularly to methods and systems for controlling the impedance of flex circuits.

BACKGROUND ART

One challenge confronting circuit designers in the electronics industry is finding more efficient and reliable methods of electrically connecting an integrated circuit chip to other circuitry. One technique is referred to as tape automated bonding, or "TAB." This interconnection technique utilizes a continuous insulative tape which is similar to photographic film to provide a planar substrate for chips that are attached to individual frames of the tape. A spider-like metal pattern of conductive traces is etched or punched from a metal foil on each frame. The traces may "fan out," i.e. radiate from the center of the frame to the edges, or may be sets of parallel lines. A chip is carefully aligned with the center of the frame, so that contacts of the chip are precisely located at corresponding conductive traces in the central portion of the frame. The chip is then attached to the TAB frame. The connection of the chip contacts to the inner portion of the frame is referred to as "inner lead bonding." The electrical performance of a single-metal TAB device is limited by parasitic inductance and capacitance of the assembly of traces. The parasitic properties limit the frequency bandwidth of the TAB device and reduce the signal-to-noise ratio.

A technique for reducing parasitic inductance and capacitance is to form a ground plane on the side of the TAB frame opposite to the conductive traces. The resulting "double-metal TAB device" is better equipped to meet the requirements of high speed digital and high frequency analog applications.

The ground plane of a double-metal TAB device must be electrically connected to establish ground potential. This can be done by the use of through holes that extend through the insulative tape from a metal foil that is used as the ground plane to ground traces of the pattern of conductive traces on the opposite side. The through holes are filled with metal. A second method of grounding the metal foil that forms the ground plane is described in U.S. Pat. No. 5,142,351 to Matta, which is assigned to the assignee of the present application. The controlled impedance TAB frame of Matta is formed without through holes. Instead, the metal foil that forms the ground plane is etched to include leads that are cantilevered from the insulative tape. The leads may then be attached to a grounded contact of the assembly to which the TAB frame is electrically connected.

While the double-metal TAB devices perform well as controlled impedance assemblies, in many circuit applications the assembly is cost prohibitive. The double-metal version of a TAB frame may have a cost that is four times that of the single-metal version. The substantial increase in cost to form a double-metal assembly applies equally to the fabrication of other controlled impedance flex circuits, such as those used as flexible printed circuit boards and flexible circuits for multi-chip modules.

What is needed is a method of forming an interconnection system for achieving a controlled impedance of a flexible circuit in a high yield and economical manner.

SUMMARY OF THE INVENTION

The present invention provides a controlled impedance interconnection system and a high-yield fabrication method by utilizing an electrically conductive adhesive both as a ground plane on a side of a flexible substrate opposite to a pattern of traces and as material to form electrical paths through the flexible substrate. Within the pattern of traces are one or more ground traces. A single application of the conductive adhesive forms the ground plane on a second surface of the substrate, fills substrate through holes to the ground traces on a first surface of the substrate, and optionally presents a bondable surface for attachment to a second substrate.

Typically, the flexible substrate is tape of a tape automated bonding frame. However, the flexible substrate may also be of the type employed for flexible printed circuit boards or multi-chip module substrates. An array of holes is formed through the substrate. The positioning of the through holes is designed to ensure proper grounding along the entirety of the ground plane to be formed.

The pattern of conductive traces on the first surface of the flexible substrate may be formed using photolithographic techniques. For example, a metal foil may be attached to the first surface and the foil may be etched to remove selected portions of the metal. The remaining portions define the pattern of traces. For a tape automated bonding frame, outer lead ends are cantilevered from the substrate following completion of the fabrication procedure.

The ground plane may be formed either before or after the patterning of the conductive traces. The electrically conductive adhesive is applied to the second surface of the flexible substrate. The adhesive fills the through holes for connection to ground traces on the first surface.

For many applications of the present invention, only the electrical properties of the adhesive will be important after the conductive adhesive has penetrated the through holes and has been fixed to the surface of the flexible substrate. In these applications, the conductive adhesive is typically a conventional conductive epoxy that is cured in a single step. Other applications may set demands for certain adhesive properties even after the conductive adhesive has been properly applied to the flexible substrate. For example, the conductive adhesive may also be employed to fix a second substrate to the flexible substrate. For these applications, the conductive adhesive is preferably a b-stage epoxy or a thermoplastic adhesive which can be partially cured on the flexible substrate prior to the attachment of the second substrate.

In addition to acting as a ground plane, the conductive adhesive may be patterned to include an electrically isolated sector that is connected by means of a through hole to a trace designed to connect to a power source, such as $V_{cc}$. That is, the conductive adhesive may be used as a constant-potential utility plane other than ground.

An advantage of the present invention is that a high frequency, controlled impedance signal propagation environment is formed in a cost-efficient fashion. The conductive adhesive may be applied in a manner compatible with reel-to-reel processing for fabricating flex circuits, such as tape automated bonding frames. Typically, the conductive adhesive is applied using screen printing techniques.

BEST MODE FOR CARRYING OUT THE INVENTION

Figure 1:
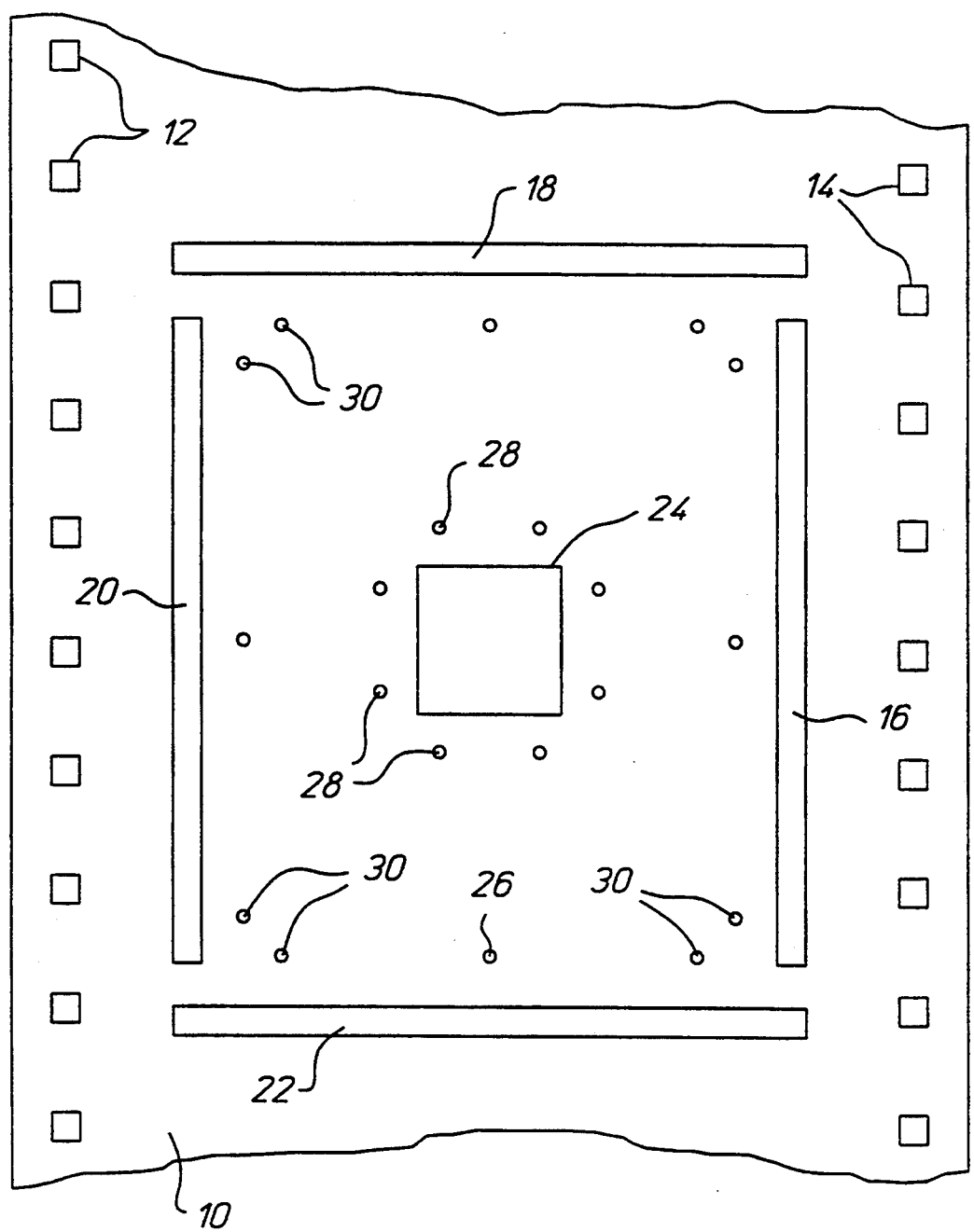
FIG. 1 is a top view of a tape automated bonding frame having through holes in accordance with the present invention.

With reference to FIG. 1, a portion of a tape automated bonding (TAB) flexible substrate 10 is shown. The flexible substrate includes a first series of sprocket holes 12 near one edge and a second series of sprocket holes 14 near the opposite edge. The sprocket holes are used to precisely move the substrate relative to fabrication equipment, not shown.

Four rectangular openings 16, 18, 20 and 22 define a TAB frame. As will be explained more fully below, an array of conductive traces is formed within the TAB frame. Typically, the ends of the traces will extend across the rectangular openings 16–22, but the ends are excised prior to use. Thus, the outer trace ends of the conductive traces will be cantilevered from the inner edges of the rectangular openings.

At the center of the frame defined by the rectangular openings 16–22 is a square opening 24. The square opening and the rectangular openings are typical of TAB processing, but are not critical to the present invention. Moreover, the opening 24 at the center of the frame may have a different geometric shape. Typically, the size and the shape of the central opening is dictated by the integrated circuit chip or other device to which the TAB frame is to be attached.

Precisely located through holes 26, 28 and 30 are formed in the flexible substrate 10. The design of the array of through holes 26–30 is aimed at ensuring uniformity of the electrical potential of a utility plane to be formed on the opposite surface of the flexible substrate 10. The through holes may be formed in the same manner as the rectangular openings 16–22 and the central square opening 24. For example, a punching operation or etching techniques may be utilized to form these features. Alternatively, the through holes may be generated by a laser.

The flexible substrate 10 conventionally employed in TAB operations is a polyimide substrate. However, other dielectrics may be substituted. In forming conductive traces on the surface of the flexible substrate, a conductive layer is plated or laminated onto the surface. For example, a copper layer having a thickness of approximately 33 μm may be formed. While not critical, a thin layer of gold may be plated onto the traces to provide a desired bondability. The composition of the metal structure is not critical to the present invention.

Figure 2:
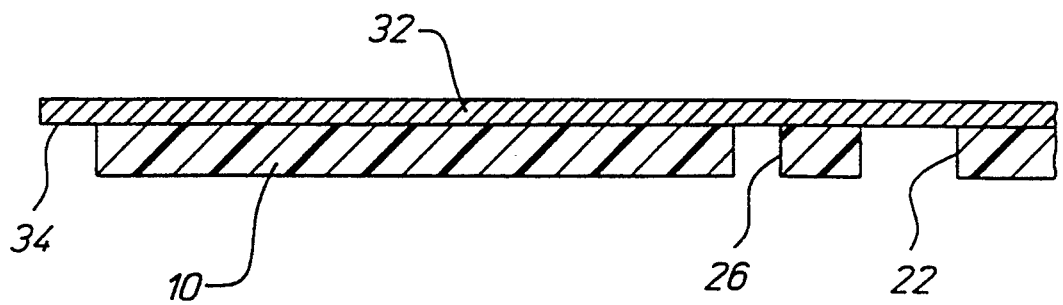
FIG. 2 is a partial, side sectional view of the frame of FIG. 1 having a conductive trace formed thereon.

The metal on the first surface is then patterned to provide conductive traces 32 such as the one shown in FIG. 2. Patterning may be carried out by photolithographic techniques that include etching away selected portions of the metal to leave a pattern of conductive traces. The conductive traces radiate from the central square opening 24 and extend across the four rectangular openings 16–22. The traces will include ground traces which will be held at ground potential during use of the TAB frame. At least some of the ground traces will extend across the through holes 26–30 of FIG. 1. The conductive trace 32 of FIG. 2 is one such ground trace, extending over through hole 26.

The pattern of traces 32 has inner lead ends 34 that are cantilevered from the flexible substrate 10. Outer lead ends extend beyond the rectangular opening 22. However, when the TAB frame is excised from the remainder of the flexible substrate, the outer lead ends are also cantilevered.

Figure 3:
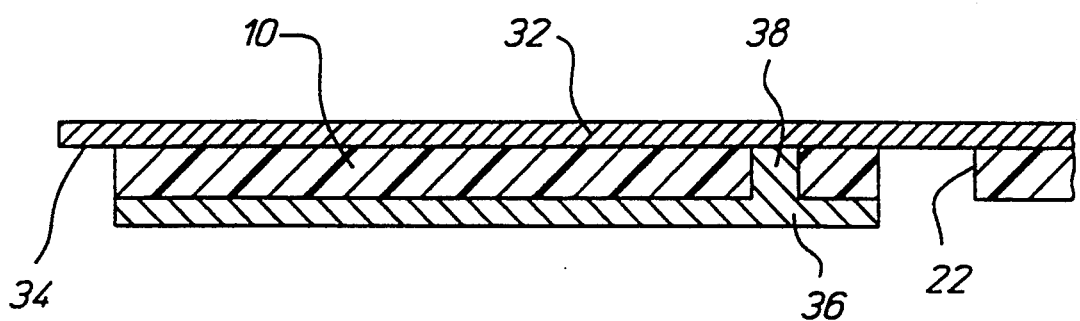
FIG. 3 is a side sectional view of the structure of FIG. 2 having a conductive adhesive deposited on a back surface and into the through hole.

Referring now to FIG. 3, a conductive adhesive 36 is then applied to the surface of the flexible substrate 10 opposite to the ground trace 32. Preferably, the conductive adhesive is applied using a screen printing method. Silkscreening is compatible with conventional processing steps. Silkscreening is sometimes used to form a solder mask atop the conductive traces of a tape automated bonding frame. While applying the conductive adhesive 36 using a syringe is not advantageous to mass producing TAB frames, syringe applications may also be used.

The conductive adhesive coats the back surface of the flexible substrate. The conductive adhesive also extends into the through hole to form a via 38 that contacts the ground trace 32. Thus, the conductive adhesive acts as a ground plane to reduce parasitic inductance and capacitance of the pattern of conductive traces.

The material for forming the conductive adhesive 36 may be formulated based on a conventional epoxy, a b-stage epoxy, or a thermoplastic adhesive. A b-stage epoxy or a thermoplastic adhesive is preferred in embodiments in which the structure of FIG. 3 is to be attached to another substrate. An acceptable b-stage adhesive is sold by Ablestick, Inc. under the trademark ABLEBOND 941-3. Acceptable thermoplastic adhesives are sold by Alpha Metals, Inc. under the trademarks STAYSTIK 581 and STAYSTIK 501. The conductive adhesive 36 is applied in a fluid condition, so that the via 38 is formed merely by the adhesive flowing into the through hole. The adhesive is then cured to fix the material in place. Typically, curing is accomplished by raising the temperature to cause cross-linking. If a b-stage epoxy or a thermoplastic adhesive is used, the material may be partially cured to facilitate shipping and handling. Following handling, the second substrate can be attached and the curing can then be completed.

The controlled impedance flex circuit of FIG. 3 provides a high frequency signal propagation environment in a manner that is compatible with conventional reel-to-reel processing for fabricating tape automated bonding frames. Consequently, the overall process flow is neither cumbersome nor prohibitively expensive.

Figure 4:
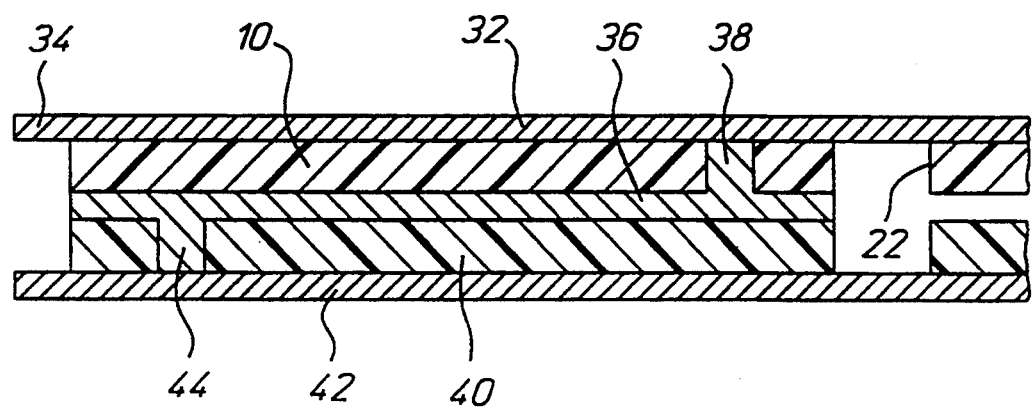
FIG. 4 is a side sectional view of the structure of FIG. 3 having a second substrate and a second pattern of conductive traces.

Optionally, the tape automated bonding frame of FIG. 3 may be combined with additional patterns of conductive traces. Referring now to FIG. 4, in addition to functioning as a ground plane, the conductive adhesive 36 binds a second flexible substrate 40 to the flexible substrate 10, whereby the ground plane is shared between the two substrates. Preferably, the second substrate also includes an application of conductive adhesive which flows into a through hole to form a via 44 to a conductive trace 42 on the opposite side of the second substrate. The two applications of the conductive adhesive are then joined together. Any number of alternating layers of traces, substrate, and conductive adhesive ground plane may be formed in the same manner.

The present invention has been described and illustrated with reference to tape automated bonding frames. The use of a film of conductive adhesive to form a ground plane for a flex circuit may also be used for fabricating other controlled impedance flex circuits, such as flexible printed circuit boards and flexible substrates of a multi-chip module.

In FIGS. 2 and 3, the ground trace 32 is patterned prior to the application of the conductive adhesive 36. Alternatively, the patterning of the conductive traces may take place subsequent to depositing the conductive adhesive. For example, a copper foil may be applied to the circuit side of the substrate 10, whereafter screen printing of the conductive adhesive occurs prior to patterning of the copper foil.

In another alternative embodiment, the via 38 of FIG. 3 may be aligned to contact a trace which is at a potential other than ground. That is, the conductive adhesive may function as a utility plane that is held at a constant potential such as 5 volts. The conductive adhesive may be patterned to include electrically isolated planes, with one plane being electrically connected to ground and a second plane being connected to a voltage source.

I claim:

1. An interconnection system comprising:
   an insulative, flexible substrate having opposed first and second surfaces and having through holes extending from said first surface to said second surface;
   a pattern of conductive traces on said first surface of said flexible substrate; and
   a utility plane on said second surface of said flexible substrate, said utility plane being an electrically conductive adhesive extending along said second surface said utility plane having a plurality of conductive members formed of said electrically conductive adhesive, said conductive members being aligned with and extending through said through holes to electrically connect to selected traces of said pattern of conductive traces, thereby forming vias through said flexible substrate from said utility plane to said conductive traces.

2. The system of claim 1 wherein said conductive traces are leads of a tape automated bonding frame, said leads having outer lead ends cantilevered from said flexible substrate.

3. The system of claim 1 wherein said conductive traces have inner lead ends and outer lead ends contained on said flexible substrate.

4. The system of claim 1 wherein said adhesive is a b-stage epoxy.

5. The system of claim 1 further comprising a second substrate fixed to said flexible substrate by said utility plane, said second substrate being flexible and having a second pattern of conductive traces on a side of said second substrate opposite to said utility plane.

6. The system of claim 1 wherein said utility plane is a ground plane extending across the entirety of said second surface of said flexible substrate.

7. The system of claim 1 wherein said conductive traces are metallic members and wherein said flexible substrate is a polyimide layer.

8. A flexible circuit comprised of:
   a layer of conductive traces;
   a layer of electrically conductive adhesive; and
   a flexible substrate having opposed first and second major surfaces and having at least one opening therethrough;
   said layer of conductive traces being disposed atop said first major surface, and including a first trace spanning a gap formed by said opening;
   said layer of electrically conductive adhesive being disposed atop said second surface;
   said layer of electrically conductive adhesive having a raised portion, said raised portion being aligned with and projecting into said opening, thereby electrically contacting said first trace.

* * * * *